United States Patent [19]

Hauck et al.

[11] Patent Number: 5,760,415

[45] Date of Patent: Jun. 2, 1998

[54] PHOTOGRAMMETRIC PROCESS FOR THE THREE-DIMENSIONAL MONITORING OF A MOVING OBJECT

[75] Inventors: Richard Hauck, Hünxe; Albrecht P. Kienemund, Oberhausen; Dieter Schrix, Kamp-Lintfort, all of Germany

[73] Assignee: Krupp Fordertechnik GmbH, Essen, Germany

[21] Appl. No.: 804,033

[22] Filed: Feb. 24, 1997

[30] Foreign Application Priority Data

Apr. 18, 1996 [DE] Germany .................... 19615246.1

[51] Int. Cl.⁶ .................................................. G01N 21/86
[52] U.S. Cl. .................... 250/559.33; 250/559.31; 250/559.46; 356/428
[58] Field of Search .................... 250/559.29, 559.31, 250/559.32, 559.33, 559.46, 223 B; 356/375, 376, 385, 240, 427, 428, 141.5; 396/153; 382/289

[56] References Cited

U.S. PATENT DOCUMENTS 4,175,328  11/1979  Kellner .................... 33/1 A

FOREIGN PATENT DOCUMENTS 42 33 007  4/1994  Germany .
43 42 522  6/1995  Germany .

OTHER PUBLICATIONS

"Formvermessung Von Crashfahrzeugen Mit Digitaler Nahbereichs–Photogrammetrie", Horst Beyer, ETH Zurich, AVNS–9/1992, 8 pages, pp. 356–363.

"DPA—Entwurf Und Realisierung Einer PC–Basierten Digitalen Arbeitsstation Fur Die Nahbereichsphotogrammetrie", Jurgen PEIPE et al Braunschweig, ZPF–Zeitschrift fur Photogrammetric und Fernerkundung Feb. 1993, 8 pages, pp. 75–82.

"Polizeiphotogrammetrie", D. Berling, Oberkochen, Sonderdruck aus Technik im Dienste der Polizei, S65–69/1969,6 pages, pp. 65–69, Jan. 1969.

*Primary Examiner*—Que Le
*Attorney, Agent, or Firm*—Herbert Dubno

[57] ABSTRACT

A photogrammetric process for the three-dimensional monitoring of moving objects can utilize at least two cameras and a triangulation system for detecting the position and orientation of the object. The object is additionally illuminated, e.g. by a flash lamp or a triggered laser to eliminate the influence of ambient light.

17 Claims, 3 Drawing Sheets

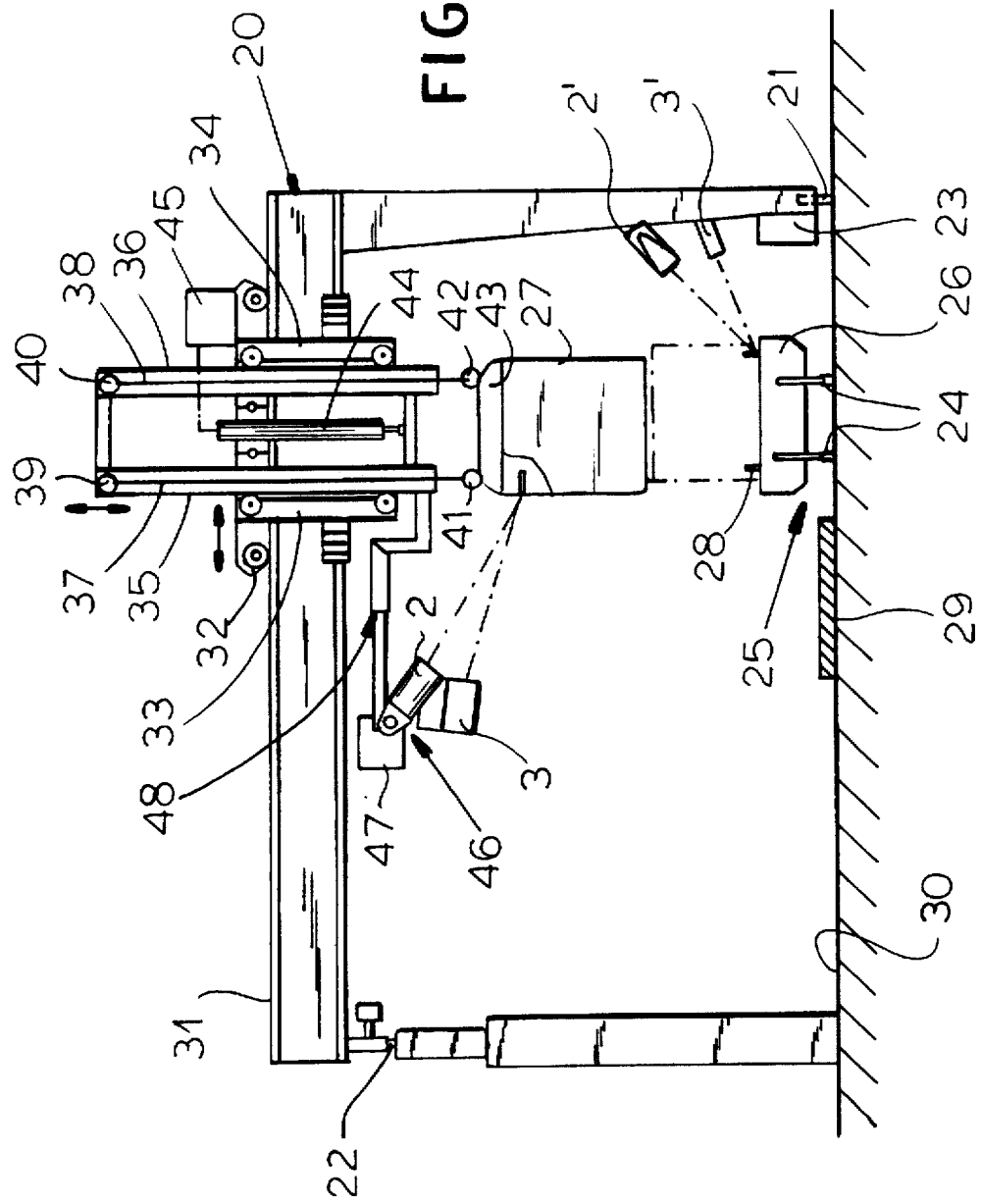

PHOTOGRAMMETRIC PROCESS FOR THE THREE-DIMENSIONAL MONITORING OF A MOVING OBJECT

FIELD OF THE INVENTION

Our present invention relates to a determination of the position and movement of a moving object and, more particularly, to a photogrammetric process for three-dimensional monitoring of a moving object to detect the position and location as a function of time utilizing generally a plurality of cameras trained upon the object and forming images which are cyclically obtained and which, by a comparison of the pictures, utilizing multi-image triangulation, is able to signal or register the location and movement of the object as a function of time.

BACKGROUND OF THE INVENTION

Photogrammetric systems for high precision three-dimensional measurements of objects are known in the art. Photogrammetric measuring processes utilize the principle that the photographic imaging of an object corresponds mathematically to a central projection of the imaged object in an image plane. Each object point is thus imaged as an image point representing an intersection of a projection ray from the object with the image plane. The projection ray depends upon the orientation of the camera with respect to the object. Based upon the location or the distance of the object points from the camera, it is possible to determine the spatial arrangements of different object points and form two or more cameras it is possible to obtain images simultaneously or successively in which corresponding object points can, via triangulation, be located in space and as to orientation. In effect, when two cameras are used, the intersections of two projection rays with the same object point and the distances between the cameras and the object points can yield information as to the position of the object in space and its orientation.

For this purpose, a so-called multi-image triangulation algorithm has been developed and is known in the art which can calculate the coordinates and the object point in question from the images picked up by a plurality of cameras. In principle it does not matter whether the images are photogrammetrically obtained or are opto-electronic images.

In the past, photogrammetric processes have been used to measure static objects with stationary cameras and for a variety of purposes substantially different from the detection of the location in space, for example, of a load unit.

In transloading systems it is desirable, for example, to provide for the removal of load units, such as cargo containers, trailers and semitrailers, from a rail vehicle, to transfer the load unit to a storage location or to apply the load unit to a track or other vehicle and, conversely, to deposit load units on a railway car, generally while the railway car is in motion. The transloader itself may be a portal crane having a lifting unit which is displaceable over the railway car and which must be aligned with the load unit. Control of such transloaders has been relatively complex heretofore.

OBJECTS OF THE INVENTION

It is the principal object of the present invention to provide an improved photogrammetrical process so that it can be used to follow moving objects independently of variations in ambient light conditions and so as to exclude measurement errors which have hitherto characterized such systems.

It is another object of the invention to provide an improved photogrammetric method which allows the same to be used effectively in a transloader system, e.g. to synchronize the transloader with a moving railway vehicle and/or to align the lifting unit of a transloader with a load unit on the rail vehicle or to align a load unit carried by the lifting unit with a particular location on the rail vehicle.

It is also an object of the invention to provide an improved transloader system with greater precision as to determination of location and orientation of a load unit and, if desired, location and speed of a rail vehicle.

SUMMARY OF THE INVENTION

These objects and others which will become apparent hereinafter are attained, in accordance with the invention in a photogrammetric process for the three-dimensional monitoring of a moving object whose location by a plurality of cameras trained from different directions on the object and which are cyclically operated to produce images which, by means of multi-image triangulation, registers the location and orientation of the object as a function of time. According to the invention, the image acquisitions are accompanied, i.e. are synchronized in time, with additional illumination.

Additional synchronized illumination minimizes significantly the ambient light effects so that the process can be carried out under all light conditions from absolute darkness to full sunlight. In addition, detrimental effects which in the past have resulted in deterioration of the measurement result are eliminated or minimized, these detrimental effects resulting from the influence of daylight, different daylight conditions such as shadow and sunlight, etc. only with the synchronous illumination of the object with image acquisition is it truly possible to utilize the method for location and orientation determination.

According to a feature of the invention, the additional illumination is effected with the aid of a rapidly switchable light source, for example, a flash lamp or strobe lamp, or with a laser diode, preferably with a flash duration of about 1 to 10 µs, preferably 1 to 5 µs. Flash lamps and especially strobe lamps are rapid modulation light sources with high light output which can be triggered for short periods, the ambient light effect being suppressed even with short flash durations.

According to a further feature of the invention, the cameras are video cameras which are cyclically rendered sensitive synchronously with the additional illumination while in remaining periods of time, the cameras are maintained in an insensitive state. The insensitive state can be approximately of 20 ms duration which corresponds at this time to the television or CCIR standard. The process is, however, useful also with other time phases. From an apparatus point of view, the electronic shutter of the camera can be directed at the flash frequency and duration. The fraction of the ambient light energy to flash lamp energy is thus relatively small since the ambient light makes a meaningful contribution only during the short light sensitivity phase.

A further minimization of the ambient light effect can be achieved when the additional illumination is effected at an angle to the image acquisition defined by the relative positions of the cameras to the object. The angle between optical axis of the light source and that of at least one of the cameras should thus be greater than the sum of the half angles of the illumination cone and the image acquisition cone. The illuminated image field which is simultaneously the object and observation field is thus limited to the observed object, i.e. only the object is illuminated and not is background. The residual effects of ambient light can be completely eliminated by image subtraction. In the cycling according to the invention only every second image acquisition is subtracted from the image acquisition made with the flash lamp. Since it is not likely that the ambient light will change between two such successive image acquisitions, the image which is used for measurement has had all ambient light effects subtracted from it and thus is totally independent of ambient light and ambient light changes.

In the difference image, of course, all of the parts illuminated only by ambient light will appear dark while object portions illuminated by ambient light will appear bright. This applies for each of the cameras. In the case of an image reading by the line jump or interlacing process, this method can be used for the full image as well as for a half image.

More particularly, a photogrammetric process for three-dimensional monitoring of a moving object to determine position or orientation and location as a function of time, the process can comprise:

(a) training upon a certain location of a moving object, whose position and location are to be determined as a function of time, a plurality of cameras from respective image-receiving locations, activating the cameras at time-spaced intervals, and acquiring with the cameras at the image-receiving locations respective images of the location;

(b) from the images and changes in the images of successive time-spaced intervals with multi-image triangulation signaling position and location of the moving object as a function of time; and (c) during at least some of the time-spaced intervals and synchronously with acquisition of the images at the at least some of the time-spaced intervals, additionally illuminating the object.

Preferably the additional illumination is triggered for a period of 1 to 10 μs.

The process is suitable for controlling a transloading system wherein the object can be received on a railway car traveling on rails as load units in the form of containers, trailers or semitrailers to be engaged by a transloader provided with a lifter for the load units and movable transversely to the rails, the process further comprising the step of controlling the lifter in removing a load unit from the car and placing a load unit on the car in accordance with the determination of position and location of the moving object as a function of time in step (b).

The process can also be used for controlling a transloading system wherein the object can be received on a railway car traveling on rails as load units in the form of containers, trailers or semitrailers to be engaged by a transloader provided with a lifter for the load units and movable transversely to the rails, the process further comprising the step of mounting the cameras and the lamp or laser on the transloader for movement therewith in a direction of movement of the object.

A transloading system embodying the invention can comprise:

a railway track having a pair of rails;

a rail car movable on the rails along the track and adapted to carry at least one load unit in the form of a container, a trailer or a semitrailer;

a transloader in the form of a portal crane spanned across the track and movable with the rail car along the rails, the transloader having a lifter displaceable transversely to the rails and raisable and lowerable to engage one of the load units on the car or to deposit a load unit on the car;

photogrammetric means for three-dimensional monitoring of a load unit on the car to determine position and location the load unit as a function of time, the photogrammetric means including:

a plurality of cameras trained upon a certain location on the load unit, means for activating the cameras at time-spaced intervals, and acquiring with the cameras at the image-receiving locations respective images of the location, computer means connected to the cameras for determining from the images and changes in the images of successive time-spaced intervals with multi-image triangulation signaling, the position and location of the load unit as a function of time, and flash means for additionally illuminating the object during at least some of the time-spaced intervals and synchronously with acquisition of the images at the at least some of the time-spaced intervals; and means for controlling the transloader in response to the position and location of the load unit as a function of time determined by the computer means.

Preferably, the image evaluation, including the image subtraction, is effected for all of the cameras by digitalizing the acquired images and processing the digitalized values in a processor unit which determines the orientation and position as a function of time and can provide an output for controlling the transloader. Preferably, the processing unit can comprise a plurality of processors and preferably a plurality of parallel-operating processors which can process two simultaneous images received from respective cameras. In this manner a real time processing of all of the camera-supplied images is possible. Preferably the cameras used are standard video cameras operating in accordance with the CCIR standard with all half-images being evaluated with a repetition frequency of 50 images per second.

According to another feature of the invention, significant or predominant surface regions or features of the object are monitored by the process described, rather than the entire object, the surface portion being monitored being characterized by a distinctive surface (coloration) and/or coding on the surface. Such partial surfaces can be, for example, corner fittings on containers, support pins or alignment pins on railway cars receiving such containers or like parts which can be readily recognized as the object to be monitored from an entire class of objects. Because of the additional illumination required by the present invention, preferably flash illumination, the particular surface characteristics of the object does not play any significant role. The observed object or object surfaces can be painted and can have any color, can be black or can be white and can vary in color or texture from the smooth to a rust state. It is only important that objects ahead or behind the object which is observed be capable of being distinguished. With the process of the invention, measurement precisions, in terms of a linear dimension of the measurement volume, can be 1% or better.

As indicated, a preferred use of the process of the invention is monitoring railway cars on a track or parts thereof, like, for example, the support pins or alignment pins on such railway cars which can receive load units deposited on the cars, or the load units themselves. Such load units can be any utilized for the bulk transport of goods and materials, and are most frequently containers, hoppers, tanks, trailers or semi-trailers and the like. The process of the invention can be used to control the transloader lifting unit for loading and unloading the railway cars and for transferring the load units to other vehicles and/or storage locations. The process of the invention is particularly adapted for today's rapidly operating transloading systems which allow unloading or loading of the rail cars on the fly. i.e. while the rail car is moving along the track, usually relatively slowly.

The so-called rendezvous technique for transloading is described in principle in DE 42 33 007 and the principles there described can also be used in the transloader of the invention. The transloading system can be associated with a storage complex or facility along which one or more tracks can extend and which can include one or more vehicle paths such as roadways and the like. The storage region can be made up of one or more multi-story structures having platforms upon which the load units can be deposited in vertical columns and rows.

Transverse displacement of load units and longitudinal displacement of load units within the storage facility may make use of conveyors of various types and, in general, such a transloading system will comprise one or more portal cranes which span across the rail track, usually one or more roadways and possibly one or more storage areas or regions which connect the storage areas by other conveyors. A portal crane is generally provided with a lifting unit displaceable along the crane beam and raisable and lowerable to engage and transfer the load unit. The portal crane itself is usually displaceable along the track, e.g. at the speed of the railway car.

A portal crane with a lifting unit which is particularly suitable for control using the process of the invention is described in DE 43 42 522 A1. This unit comprises a lifting frame having two columns connected by at least transverse and which are raised and lowered on a carriage horizontally displaceable along the crane beam. The columns contain respective rods which are connected to the column at their upper ends by universal joints (usually ball joints or other cardan joints) and articulated at their lower ends to a spreader or other gripping device engageable with the load unit. Means is provided for raising and lowering columns which are of box cross section and which ensure a linear displacement in the vertical direction. The articulations at the lower end can also be universal joints, i.e. cardan or ball joints.

To displace this lifting unit, the spreader or gripper must be exactly positioned relative to the rail car to be unloaded or loaded and thus the process of the invention can be used to control the movement of the portal crane with the car and to control the alignment of the gripper with the load unit on the car or with a position on the car on which the load unit is to be deposited.

The system of the invention for use with the transloader thus comprises at least two cameras and an additional illuminator on the transloader. Utilizing the photogrammetric process of the invention, the relative position of the transloader and the load unit or the rail car can be measured and from a comparison between the measured value and the set point, the transloader can be displaced to eliminate the difference.

According to yet another feature of the invention, the measurement system comprising the two cameras and the illuminator can be mounted on a support which is telescopically movable on the transloader and which can be automatically displaced relative to the transloader to automatically follow the position of the object relative to the transloader. For control of the transloader during the pick up and loading of a load unit, at least one measurement system utilizing the principles of the invention can be provided at a fixed position outside the load transfer regions and trained on the railway car by means of a telescope so that control of the synchronous displacement of the transloader can be maintained during the transloading operation based upon parameters of the car.

The fixed position outside the transloading region can be a distinctive portion of an object, say, on the car adjacent the object to be removed or adjacent the region in which an object is to be deposited, or support or alignment pins on the railway car when the latter has no adjoining load unit.

The photogrammetric process of the invention with integrated pattern recognition to determine the homologous points used for triangulation and then control of the transloading, unloading or load processes is usually carried out with the spaced apart cameras with a cycle time of about 20 ms, the simultaneously acquired images being digitalized and processed in a parallel processor computer. With each second image acquisition, synchronously with the image acquisition, a flash is generated to illuminate the target point on the object to provide the additional illumination over a period of 10 μm. The other image acquisitions are effected without flash. By image subtraction, therefore, the environmental light influence is completely eliminated so that a measurement precision in terms of the location coordinates and the measurement volume or orientation of better than 1% can be achieved. The environmental light effects are better eliminated and the flash duration is shorter and the flash intensity is greater.

BRIEF DESCRIPTION OF THE DRAWING

The above and other objects, features, and advantages will become more readily apparent from the following description, reference being made to the accompanying drawing in which:

FIG. 3 is a vertical section taken transverse to a transloading system and illustrating an application of the process of the invention.

SPECIFIC DESCRIPTION

Figure 1:
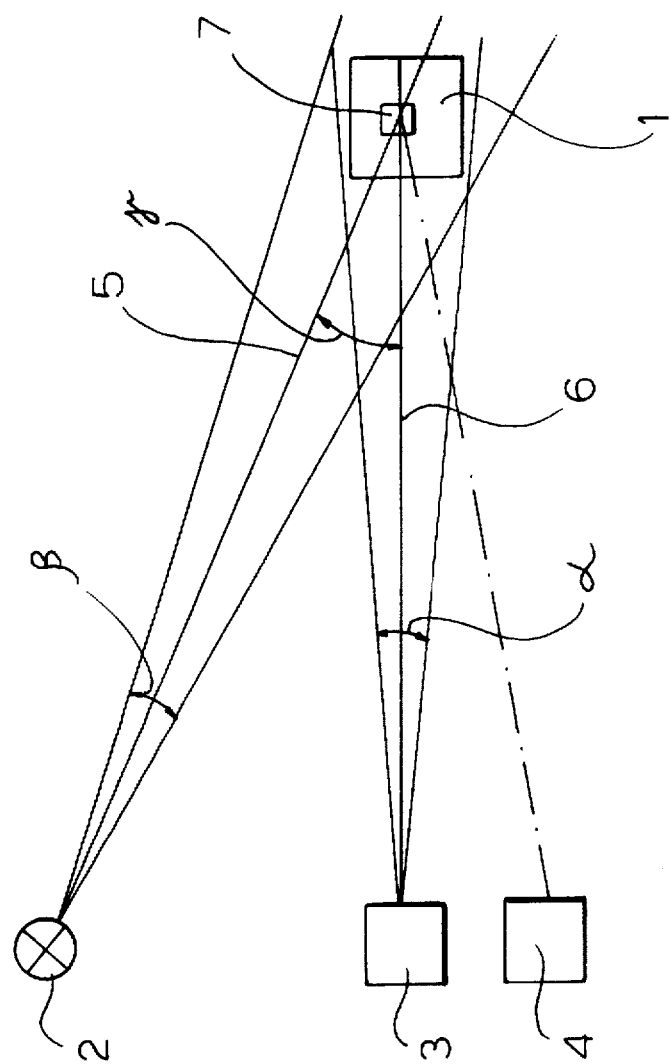
FIG. 1 is a block diagram illustrating principles of the present invention.

As can be seen from FIG. 1, an object 1, for example a load unit of the type described, is optionally illuminated by a light source 2 whose illumination cone has an apex angle $\beta$ with a half angle $\beta/2$ on opposite sides of the illumination optical axis 5. The lamp 2 is a flash lamp or a laser triggered for a very brief period of time and preferably targeted at a coded or otherwise distinctive region 7 of the object. The flash is effected simultaneously with the actuation of two cameras 3, 4 with image acquisition cones with apex angles $\alpha$, the image cone only of the camera 3 being illustrated in FIG. 1. The image cone has the optical axis 6 intersecting the optical axis 5 at the location 7.

According to the invention, the angles $\alpha$ and $\beta$ are so selected that $(\alpha/2)+(\beta/2) \geq \gamma$ where $\gamma$ is the angle between the optical axes 5 and 6.

Figure 2:
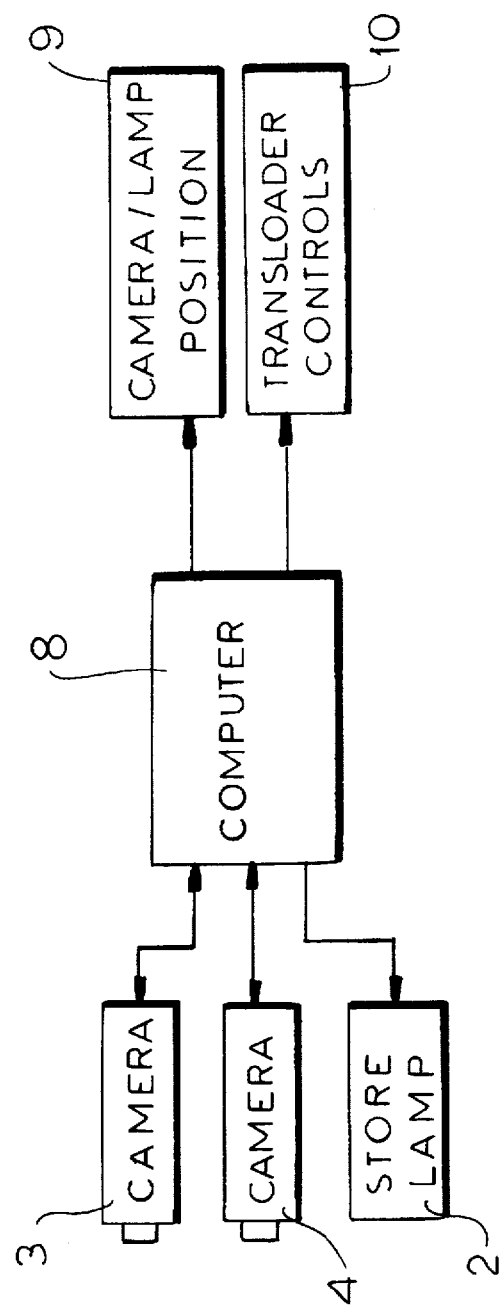
FIG. 2 is another block diagram for use in explaining the invention.

As will be apparent from FIG. 2, each of the cameras 3 and 4 provide inputs to a parallel processing computer 8 which initially digitalizes the images received, subtracts the image acquired without the additional illumination or flash from a preceding flash illumination image and processes the resulting values into a measure of the position and orientation of the object which is then used to operate the controller 9 for the position of the lamp and cameras, i.e. to ensure that the lamp and cameras track the relative movement of the support for the cameras and lamp and the object. The control 10 for the transloader is likewise operated from the computer which triggers the strobe lamp 2 as well.

In FIG. 3, a transloader system has been illustrated which comprises a portal crane 20 movable on rails 21 and 22 by a drive 23 parallel to the rails 24 of a track 25 along which rail cars 26 are displaceable with load units 27. The car 26 may have carrying pins 28 which can support the load unit, e.g. a container, or can align the load unit as has been mentioned previously. Alongside the track 25 is a roadway 29 for trucks or the like which can receive or deliver load units and a storage region 30 in which load units can be stored and from which load units can be transferred to multi-storied shelving and the like for vertical storage if desired.

The portal crane 20 has a beam 31 along which a carriage 32 is displaceable horizontally and this carriage is provided with guides 33 and 34 for a pair of box-section columns 35 and 36, at the upper end of which, rods 37 and 38 are pivotally mounted in respective universal or cardan joints 39 and 40.

At their lower ends, extending from the columns 35 and 36, the rods 37 and 38 have articulations 41 and 42 which are likewise universal or cardan joints and connecting these rods to a gripper 43 engageable with the load unit 27.

A hydraulic cylinder arrangement 44 raises and lowers columns 35 and 36 on the carriage and a drive for the carriage horizontally is shown at 45. In addition, transverse cylinders can shove the gripper 43 relative to the carriage 32 for accurate positioning of the gripper above the load unit, when the latter is to be removed from the car, or for aligning the load unit with the car when the container is to be deposited thereon.

The system shown in FIG. 3 operates in the usual manner with respect to picking up and depositing load units, except that a camera and lamp assembly 46 as described in connection with FIG. 1 can be mounted at 47 on a telescopically movable support 48 connected to the transloader and following the container as the transloader is shifted relative thereto or to the car 23. The unit 47 is responsive to the controller 9. Another combination of flash lamp cameras can be provided at 2', 3' in FIG. 3 and trained upon the pin 28 of the car 26 for synchronizing the portal crane 20 with the car. The controlled elements 23, 44 and 45 can all be operated by the transloader controls 10 previously described.

We claim:

1. A photogrammetric process for three-dimensional monitoring of a moving object to determine position and location as a function of time, said process comprising the steps of:

(a) training upon a certain location of a moving object, whose position and location are to be determined as a function of time, a plurality of cameras from respective image-receiving locations, activating said cameras at time-spaced intervals, and acquiring with said cameras at said image-receiving locations respective images of said location;

(b) from said images and changes in said images of successive time-spaced intervals with multi-image triangulation signaling position and location of said moving object as a function of time; and (c) during at least some of said time-spaced intervals and synchronously with acquisition of said images at said at least some of said time-spaced intervals, additionally illuminating said object.

2. The process defined in claim 1 wherein the additional illumination of said object is effected by triggering a flash lamp or laser diode.

3. The process defined in claim 2 wherein the additional illumination is triggered for a period of 1 to 10 µs.

4. The process defined in claim 3 wherein the additional illumination is triggered for a period of 1 to 5 µs.

5. The process defined in claim 3 wherein said cameras are video cameras, the process comprising the step of triggering said cameras into sensitive modes synchronously with triggering of said additional illumination while maintaining said camera light-insensitive between periods of sensitivity.

6. The process defined in claim 5 wherein the cameras are maintained light-insensitive for periods of about 20 ms.

7. The process defined in claim 3 wherein the additional illumination is directed upon said location along an illumination optical axis with an illumination cone having a half-angle $\alpha$, one of said cameras having a camera optical axis directed toward said location at an intersection of said illumination optical axis therewith and an imaging cone with a half-angle $\beta$, said process further comprising the step of maintaining an angle $\gamma$ between said optical axes which is greater than a sum of said half-angles.

8. The process defined in claim 3 wherein, in a cycle of image acquisitions with each camera, said location is additionally illuminated only with each second image acquisition and brightness of an image acquisition without additional illumination is subtracted from brightness with additional illumination in each cycle to form an image used in said multi-image triangulation.

9. The process defined in claim 3 wherein, for the multi-image triangulation each image is digitalized and a digital signal is fed to a processor unit with a plurality of processors for signaling position and location of said moving object as a function of time.

10. The process defined in claim 3 wherein said object is provided at said location with a characteristic pattern or coding recognizable by said cameras.

11. The process defined in claim 3 for controlling a transloading system wherein said object can be received on a railway car traveling on rails as load units in the form of containers, trailers or semitrailers to be engaged by a transloader provided with a lifter for said load units and movable transversely to said rails, said process further comprising the step of controlling said lifter in removing a load unit from said car and placing a load unit on said car in accordance with the determination of position and location of said moving object as a function of time in step (b).

12. The process defined in claim 3 for controlling a transloading system wherein said object can be received on a railway car traveling on rails as load units in the form of containers, trailers or semitrailers to be engaged by a transloader provided with a lifter for said load units and movable transversely to said rails, said process further comprising the step of mounting said cameras and said lamp or laser on said transloader for movement therewith in a direction of movement of said object.

13. The process defined in claim 12 wherein said movement of said transloader in said direction of movement of said object is effected after detection of a reference point on the moving object and determining a speed of said reference point which is used as a set point for an adjustment of speed of said transloader.

14. The process defined in claim 3 for controlling a transloading system wherein said object can be received on a railway car traveling on rails as load units in the form of containers, trailers or semitrailers to be engaged by a transloader provided with a lifter for said load units and movable transversely to said rails, and wherein the lamp or laser are telescopically movable on movable and guided supports and are automatically displaced in accordance with variations in relative positions of said transloader and the movable object.

15. The process defined in claim 14 wherein at least one measuring system comprising cameras and an additional illumination device is trained on a fixed position outside a loading and unloading region of said car to provide car-related measurements to the transloader for control of the transloading.

16. The process defined in claim 15 wherein said fixed position is a corner fitting of a further load unit on said car or a support pin when there is no further load unit on said car.

17. A transloading system comprising:

a railway track having a pair of rails;

a rail car movable on said rails along said track and adapted to carry at least one load unit in the form of a container, a trailer or a semitrailer;

a transloader in the form of a portal crane spanned across said track and movable with said rail car along said rails, said transloader having a lifter displaceable transversely to said rails and raisable and lowerable to engage one of said load units on said car or to deposit a load unit on said car;

photogrammetric means for three-dimensional monitoring of a load unit on said car to determine position and location said load unit as a function of time, said photogrammetric means including:

a plurality of cameras trained upon a certain location on said load unit, means for activating said cameras at time-spaced intervals, and acquiring with said cameras at said image-receiving locations respective images of said location, computer means connected to said cameras for determining from said images and changes in said images of successive time-spaced intervals with multi-image triangulation signaling, the position and location of said load unit as a function of time, and flash means for additionally illuminating said object during at least some of said time-spaced intervals and synchronously with acquisition of said images at said at least some of said time-spaced intervals; and means for controlling said transloader in response to the position and location of said load unit as a function of time determined by said computer means.

* * * * *